US011552656B2

(12) United States Patent
Roh et al.

(10) Patent No.: US 11,552,656 B2
(45) Date of Patent: Jan. 10, 2023

(54) CURRENT MODE LOGIC DRIVER AND TRANSMISSION DRIVER INCLUDING THE SAME

(71) Applicant: MagnaChip Semiconductor, Ltd., Cheongju-si (KR)

(72) Inventors: Gil Sung Roh, Cheongju-si (KR); Sang Kyung Kim, Daejeon (KR)

(73) Assignee: MagnaChip Semiconductor, Ltd., Cheongju-si (KR)

(*) Notice: Subject to any disclaimer, the term of this patent is extended or adjusted under 35 U.S.C. 154(b) by 0 days.

(21) Appl. No.: 17/322,002

(22) Filed: May 17, 2021

(65) Prior Publication Data
US 2022/0045701 A1   Feb. 10, 2022

(30) Foreign Application Priority Data
Aug. 10, 2020  (KR) .................. 10-2020-0099677

(51) Int. Cl.
| | | |
|---|---|---|
| H03K 3/00 | (2006.01) | |
| H03K 19/094 | (2006.01) | |
| H03K 19/20 | (2006.01) | |
| G05F 3/26 | (2006.01) | |
| H04B 1/04 | (2006.01) | |
| H03K 17/687 | (2006.01) | |
| H03F 3/45 | (2006.01) | |

(52) U.S. Cl.
CPC ........... *H04B 1/04* (2013.01); *H03F 3/45475* (2013.01); *H03K 17/6871* (2013.01); *H03F 2200/129* (2013.01); *H04B 2001/045* (2013.01)

(58) Field of Classification Search
None
See application file for complete search history.

(56) References Cited

U.S. PATENT DOCUMENTS

| | | | | |
|---|---|---|---|---|
| 5,070,305 A * | 12/1991 | Confalonieri | ............. | H03F 3/26 330/148 |
| 6,329,876 B1 * | 12/2001 | Llewellyn | ................ | H03F 1/26 330/69 |
| 7,173,489 B1 * | 2/2007 | Song | .................... | H03G 1/0088 330/254 |
| 8,248,135 B2 * | 8/2012 | Yu | ......................... | H04L 25/063 327/280 |
| 8,330,199 B2 * | 12/2012 | Kamakura | .......... | H01L 27/0802 257/300 |
| 8,446,168 B2 | 5/2013 | Maarouf | | |

(Continued)

FOREIGN PATENT DOCUMENTS

KR      10-1726396 B1      4/2017

*Primary Examiner* — Kenneth B Wells
(74) *Attorney, Agent, or Firm* — NSIP Law

(57) ABSTRACT

A transmission driver includes a pulse generator and a current mode logic driver. The pulse generator is configured to generate and output a first pulse signal by synchronizing at a falling edge time point of a first input signal, and generate and output a second pulse signal by synchronizing at a falling edge time point of a second input signal. The current mode logic driver is configured to output a pre-emphasis signal to which pre-emphasis technique has been applied by changing a first load resistance value and a second load resistance value based on the first pulse signal and the second pulse signal, respectively.

19 Claims, 11 Drawing Sheets

(56) References Cited

U.S. PATENT DOCUMENTS

| | | | |
|---|---|---|---|
| 8,604,871 B2* | 12/2013 | Myles | H03F 3/45 |
| | | | 330/69 |
| 9,094,244 B2 | 7/2015 | Hwang | |
| 10,135,442 B2* | 11/2018 | Tang | H03K 19/09 |
| 11,031,936 B1* | 6/2021 | Luo | H03K 19/018514 |
| 2008/0150584 A1* | 6/2008 | Tanaka | H03K 19/01721 |
| | | | 326/115 |
| 2012/0326745 A1* | 12/2012 | Kothandaraman | |
| | | | H03K 19/018528 |
| | | | 326/82 |
| 2013/0214843 A1* | 8/2013 | Ha | H03K 19/018514 |
| | | | 327/333 |

* cited by examiner (a)

(b)

-- Background Art --

-- Background Art --

-- Background Art --

-- Background Art --

CURRENT MODE LOGIC DRIVER AND TRANSMISSION DRIVER INCLUDING THE SAME

CROSS-REFERENCE(S) TO RELATED APPLICATIONS

This application claims the benefit under 35 USC 119(a) of Korean Patent Application No. 10-2020-0099677 filed on Aug. 10, 2020 in the Korean Intellectual Property Office, the entire disclosure of which is incorporated herein by reference for all purposes.

BACKGROUND

1. Field

The present disclosure relates to a current mode logic driver and transmission driver including the same.

2. Description of Related Art

When a digital signal is transmitted through a channel with a loss in the transmission end of a semiconductor device, the receiving end may receive the transmitted signal distorted by the frequency component of the channel.

In general, since the channel with a loss has more loss in a high frequency range, a high frequency component of the signal which is transmitted through such a channel is more attenuated than a low frequency component. The high frequency component of the digital signal corresponds mainly to a portion where the voltage level of the signal rapidly changes, that is, a rising edge or a falling edge. Thus, the signal which has passed through the channel with a loss has a distorted waveform compared to the original waveform thereof, and the time required for the transmitted signal to reach may be different according to the frequency. As a result, a lot of jitter may occur and the timing margin may be significantly reduced overall. Additionally, there is a problem of inter-symbol interference (ISI). A time required for the signal to reach is changed according to the frequency component due to the loss within the channel. Therefore, when the channel is long or a highspeed communication is performed, continuous data may be overlapped and incorrectly transmitted.

In order to solve these problems, a buffer circuit which is used in the receiving end of a conventional semiconductor device emphasizes or suppresses the signal in accordance with the frequency band, so that the signal is compensated as much as the signal is distorted during passing through the channel, and finally the receiving end controls the waveform of the signal to receive the original signal. This technique is referred to as equalization and includes pre-emphasis technique and de-emphasis technique as a representative.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a transmission driver includes a pulse generator and a current mode logic driver. The pulse generator is configured to generate and output a first pulse signal by synchronizing at a falling edge time point of a first input signal, and generate and output a second pulse signal by synchronizing at a falling edge time point of a second input signal. The current mode logic driver is configured to output a pre-emphasis signal to which pre-emphasis technique has been applied by changing a first load resistance value and a second load resistance value based on the first pulse signal and the second pulse signal, respectively.

The transmission driver may further include a phase inverter configured to receive an input signal and output the first input signal and the second input signal to the pulse generator and the current mode logic driver, respectively.

The phase inverter may include a first OP amp configured to generate the first input signal by buffering the input signal, and an inverting amplifier, comprising two resistors and a second OP amp, configured to generate the second input signal by inverting a phase of the first input signal.

The current mode logic driver may include a first NMOS transistor, configured to receive the first input signal through a gate terminal, connected between a first output node and a third common node, a second NMOS transistor, configured to receive the second input signal through the gate terminal, connected between a second output node and the third common node, and a third NMOS transistor connected in series to the first and second NMOS transistors.

The third NMOS transistor may be turned on according to a bias control signal to flow a bias current activating the current mode logic driver.

The current mode logic driver may include a first load controller, connected between the first output node and a power supply voltage, controlling the first load resistance value by receiving the first pulse signal, and a second load controller, connected between the second output node and the power supply voltage, controlling the second load resistance value by receiving the second pulse signal.

The first load controller may include a first resistor having an end connected to the power supply voltage and another end connected to the first output node, a first variable resistor having an end connected to the power supply voltage, and a first PMOS transistor connecting the first pulse signal to the gate terminal, a source terminal to another end of the first variable resistor, and a drain terminal to the first output node.

The second load controller may include a second resistor having an end connected to the power supply voltage and another end connected to the second output node, a second variable resistor having an end connected to the power supply voltage, and a second PMOS transistor connecting the second pulse signal to the gate terminal, the source terminal to another end of the second variable resistor, and the drain terminal to the second output node.

The current mode logic driver may further include third resistors connected between the first output node and the second output node.

The first pulse signal generated in synchronization with the falling edge time point of the first input signal may have a low level first section. The second pulse signal generated in synchronization with the falling edge time point of the second input signal may have a low level second section.

In the first section, the first NMOS transistor and the second PMOS transistor may be turned off in the first section, and the second NMOS transistor and the first PMOS transistor may be turned on.

In the second section, the first NMOS transistor and the second PMOS transistor may be turned on, and the second NMOS transistor and the first PMOS transistor may be turned off.

In the first and second sections, the pre-emphasis signal may be output by controlling the first and second load resistance values of the current mode logic driver.

In another general aspect, a current mode logic driver includes a first load controller, a second load controller, a first NMOS transistor, a second NMOS transistor, and a third NMOS transistor. The first load controller, controlled by a first pulse signal, is connected to a power supply voltage. The second load controller, controlled by a second pulse signal, is connected to the power supply voltage. The first NMOS transistor is connected in series to the first load controller. The second NMOS transistor is connected in series to the second load controller. The third NMOS transistor is connected in series to the first and second NMOS transistors.

The first and second NMOS transistors may be configured to receive first and second input signals having different levels.

The third NMOS transistor may be turned on according to a bias control signal to flow a bias current.

The first load controller may include a first resistor having an end connected to the power supply voltage and another end connected to a first output node, a first variable resistor having an end connected to the power supply voltage, and a first PMOS transistor connecting the first pulse signal to a gate terminal, a source terminal to another end of the first variable resistor, and a drain terminal to the first output node.

The second load controller may include a second resistor having an end connected to the power supply voltage and another end connected to a second output node, a second variable resistor having an end connected to the power supply voltage, and a second PMOS transistor connecting the second pulse signal to the gate terminal, the source terminal to another end of the second variable resistor, and the drain terminal to the second output node.

The first pulse signal generated in synchronization with a falling edge time point of the first input signal may have a low level first section. The second pulse signal generated in synchronization with a falling edge time point of the second input signal may have a low level second section.

A pre-emphasis signal to which pre-emphasis technique has been applied may be output by variable resistor control of the first and second load controllers in the first and second sections.

In another general aspect, a transmission driver includes a pulse generator and a current mode logic driver. The pulse generator is configured to synchronize at a falling edge time point of a first input signal to generate a first pulse signal, and at a falling edge time point of a second input signal to generate a second pulse signal. The current mode logic driver includes a first load controller, controlled by the first pulse signal, connected to a power supply voltage, and a second load controller, controlled by the second pulse signal, connected to the power supply voltage.

The current mode logic driver may further include a first NMOS transistor connected in series to the first load controller, a second NMOS transistor connected in series to the second load controller, and a third NMOS transistor connected in series to the first and second NMOS transistors.

The current mode logic driver may be configured to output a pre-emphasis signal to which pre-emphasis technique has been applied by changing a first load resistance value and a second load resistance value based on the first pulse signal and the second pulse signal, respectively.

The transmission driver may further include a phase inverter configured to receive an input signal and output the first input signal and the second input signal to the pulse generator and the current mode logic driver, respectively.

The phase inverter may include a first OP amp configured to generate the first input signal by buffering the input signal, and an inverting amplifier, comprising two resistors and a second OP amp, configured to generate the second input signal by inverting a phase of the first input signal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
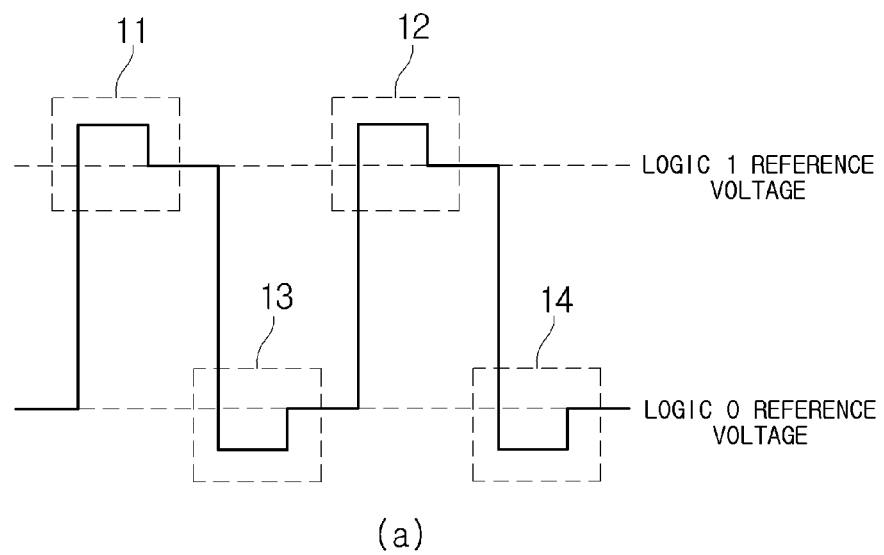
FIG. 1 is a view describing pre-emphasis and de-emphasis techniques which are used in a general buffer circuit.
Figure 1:
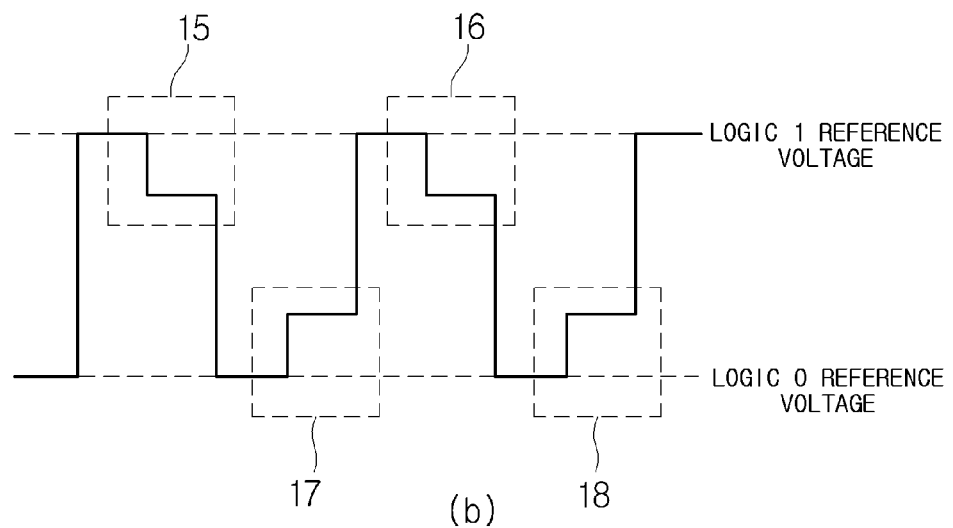

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view describing pre-emphasis and de-emphasis techniques, which are used in a general buffer circuit.

In (a) of FIG. 1, according to the pre-emphasis technique, when a logic bit 0 is converted into 1 or a logic bit 1 is converted into 0, a front portion of the bit which is converted is set to be lower or higher than a reference voltage of the bit which is converted. That is, when the logic bit 0 is converted into 1, a voltage of the front edge of the 1 bit is set to be higher than a reference voltage of the logic bit 1 (see reference numerals 11 and 12). Likewise, when the logic bit 1 is converted into 0, a voltage of the front edge of the 0 bit is set to be lower than a reference voltage of the logic bit 0 (see reference numerals 13 and 14). The high frequency component of the signal appears mainly at the edge. It can be said that the pre-emphasis technique is to increase the amplitude of the signal at the edge as much as the signal is attenuated in the channel.

In (b) of FIG. 1, according to the de-emphasis, when a logic bit 0 is converted into 1 or a logic bit 1 is converted into 0, a rear portion of the bit which is converted is set to be higher or lower than a reference voltage of the bit which is converted. That is, when the logic bit 0 is converted into 1, a voltage of the rear edge of the 1 bit is set to be lower than the reference voltage of the logic bit 1 (see reference numerals 15 and 16). Likewise, when the logic bit 1 is converted into 0, a voltage of the rear edge of the 0 bit is set to be higher than the reference voltage of the logic bit 0 (see reference numerals 17 and 18). By applying the de-emphasis technique, the amplitude of the front part of the signal is relatively emphasized, so that the equalization can be achieved even though the amplitude is attenuated due to the high frequency component present in the front part of the signal.

In the design of the buffer circuit which is used to receive a signal in a general semiconductor device, there is a need to develop a technology for implementing the pre-emphasis or de-emphasis equalization.

Figure 2:
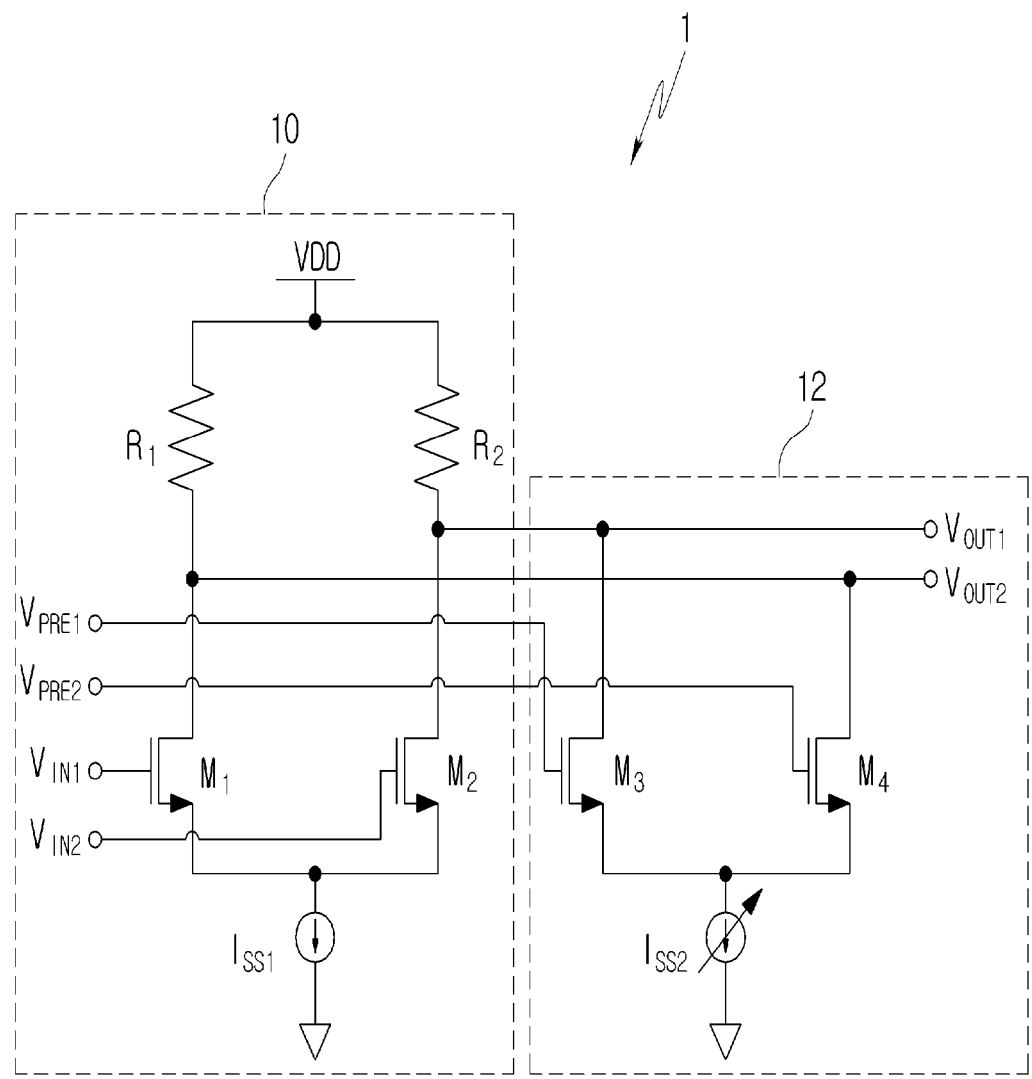
FIG. 2 is a circuit diagram of an example of a general current mode logic (CML) driver having the pre-emphasis function.

FIG. 2 is a circuit diagram of an example of a general current mode logic (CML) driver having a pre-emphasis function.

In FIG. 2, the general CML driver 1 may be a circuit module that is usually used at the final stage when data is transmitted in a wired manner. The CML driver 1 may include a main driver 10 and a pre-emphasis driver 12. The main driver 10 may include MOS transistors M1 and M2, resistors R1 and R2, and a first current source Iss1. The main driver 10 receives serialized differential input signals VIN1 and VIN2 and outputs differential output signals Vout1 and Vout2. The pre-emphasis driver 12 may include MOS transistors M3 and M4 and a second current source Iss2, and a pre-emphasis ratio of the differential output signals Vout1 and Vout2 is controlled by varying the second current source Iss2.

Figure 3:
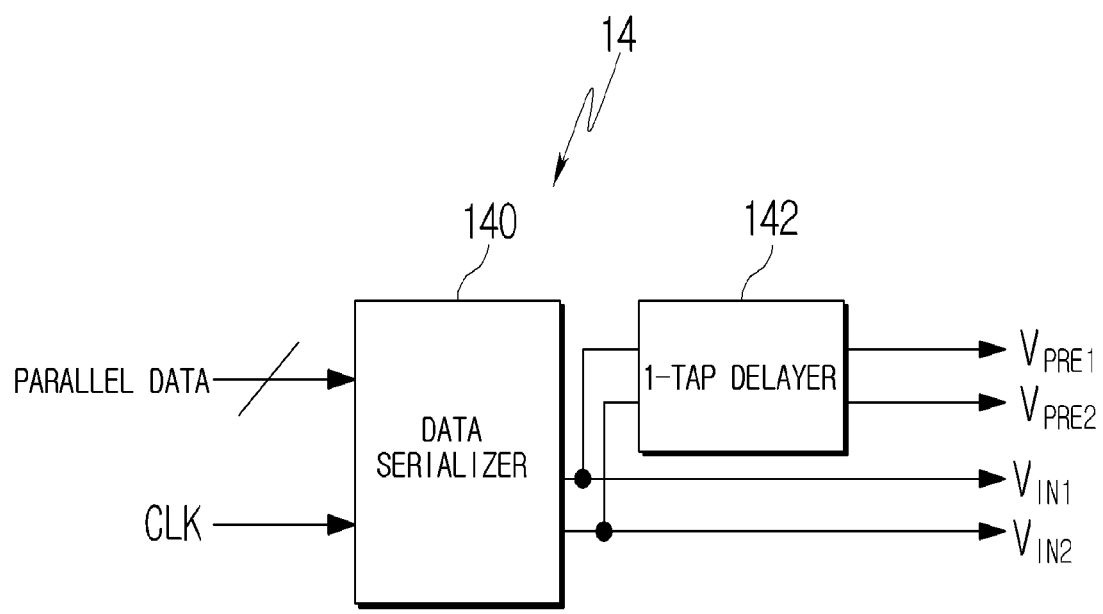
FIG. 3 is a circuit diagram of an example of a logic circuitry that provides input data to the general CML driver.
Figure 4:
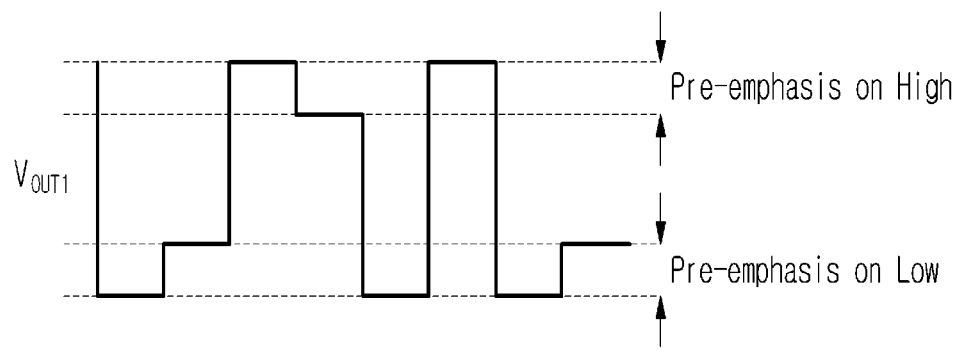
FIG. 4 is a waveform diagram of an example of an output signal Vout1 of the general CML driver.

FIG. 3 is a circuit diagram of an example of a logic circuitry that provides input data to the general CML driver. FIG. 4 is a waveform diagram of an example of the output signal Vout1 of the general CML driver.

In FIGS. 2 to 4, logic circuitry 14 provides an input data to the CML driver 1. The logic circuitry 14 includes a data serializer 140 and a 1-tap delayer 142. The data serializer 140 is configured to receive parallel data and a clock signal CLK and serializes the parallel data. The serialized data is input as a differential signal to the main driver 10 of the CML driver 1 in the form of the input signal VIN1 and VIN2. Meanwhile, the 1-tap delayer 142 is used to provide the pre-emphasis driver 12 with input signals VpRE1 and VPRE2 for the pre-emphasis technique. The 1-tap delayer 142 is a circuit which delays the serialized data VIN1 and VIN2 by 1 bit.

The pre-emphasis function of the CML driver described in FIGS. 2 to 4 is implemented in the manner of controlling a bias current of the CML driver by using whether the data is repeated or not. However, since the pre-emphasis function of the CML driver controls the bias current, depending on the data, current consumption is increased when the pre-emphasis function is applied to the repeated data or clock. Therefore, the CML driver of the present disclosure controls a termination resistor without controlling the bias current for the repeated data or clock. Accordingly, it is intended to implement the CML driver capable of the pre-emphasis technique without the increase of the current consumption.

Figure 5:
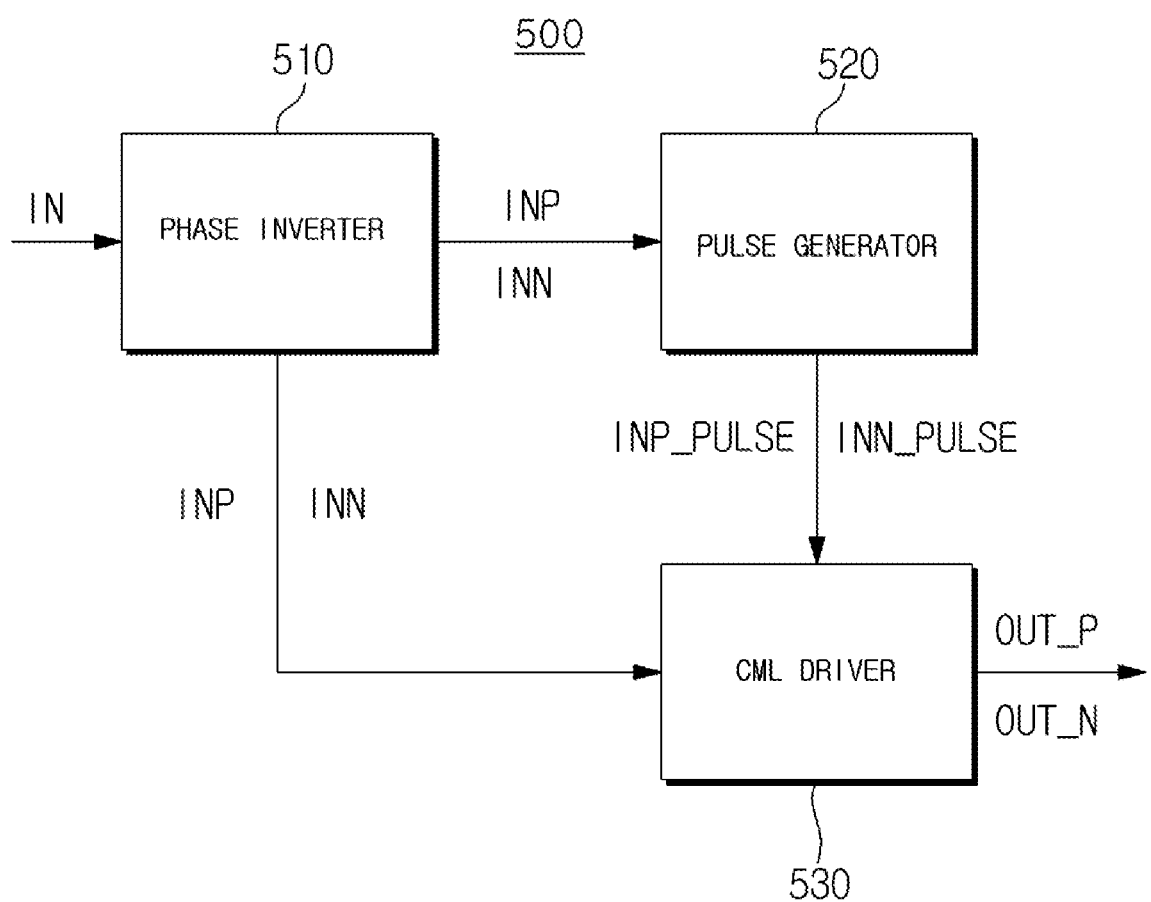
FIG. 5 is a block diagram of an example of a transmission driver.
Figure 6:
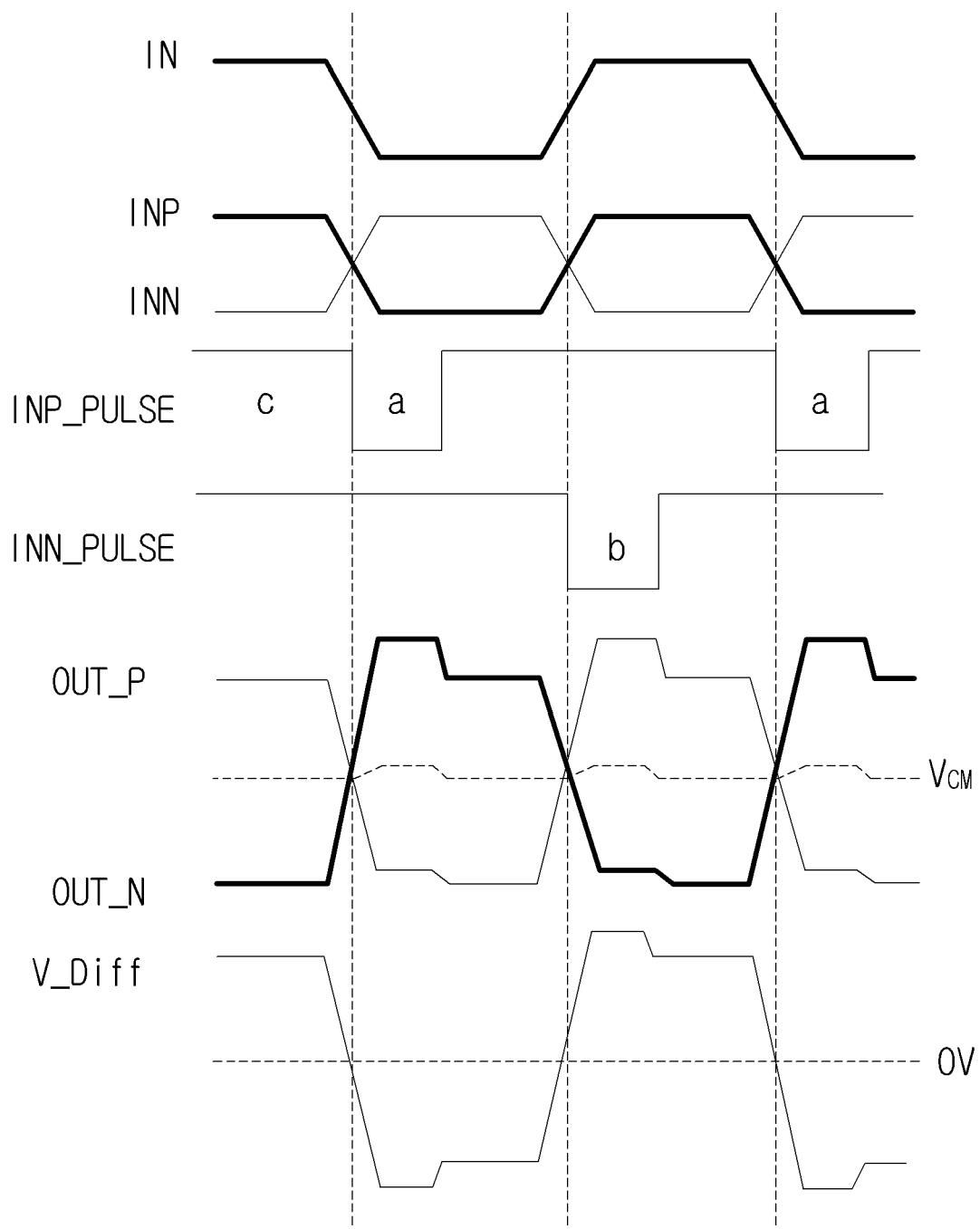
FIG. 6 is a view showing waveforms of an example of input signal and output signal of each block constituting the transmission driver.

FIG. 5 is a block diagram of an example of a transmission driver. FIG. 6 is a view showing waveforms of an example of input signal and output signal of each block constituting the transmission driver.

In FIGS. 5 and 6, the transmission driver may be configured for the pre-emphasis and may have the pre-emphasis function.

The transmission driver 500 includes a phase inverter 510, a pulse generator 520, and a CML driver 530.

The phase inverter 510 may output a first input signal INP by receiving an input signal IN received from the outside and buffering. Also, the phase inverter 510 may output a second input signal INN by inverting a phase of the first input signal INP.

The pulse generator 520 is configured to receive the first input signal INP and the second input signal INN output from the phase inverter 510. The pulse generator 520 is configured to synchronize at a falling edge time point of the first input signal INP received from the phase inverter 510, and generate and output a first pulse signal INP-PULSE. The pulse generator 520 is configured to synchronize at a falling edge time point of the second input signal INN received, and generate and output a second pulse signal INN-PULSE.

The first and second input signals INP and INN output by the phase inverter 510 are transmitted to the pulse generator 520. The pulse generator 520 may synchronize, as shown in FIG. 6, at the falling edge time points of the first input signal INP and the second input signal INN and generate the first pulse signal INP-PULSE and the second pulse signal INN-PULSE as a low level pulse signal.

The CML driver 530 outputs a signal in accordance with an amplification gain adjusted by the termination resistance value. Specifically, the CML driver 530 compares the first input signal INP with the second input signal INN received from the phase inverter 510 and outputs a signal in accordance with the amplification gain adjusted by a first load resistance value and a second load resistance value. According to various embodiments, the CML driver 530 may directly receive the first input signal INP from an external source without passing through the phase inverter. The CML driver 530 outputs a first output signal OUT_N through a first output node N1, and outputs a second output signal OUT_P through a second output node N2. The first output signal OUT_N which is output through the first output node N1 and the second output signal OUT_P which is output through the second output node N2 are transmitted as a differential input signal to a load unit connected to the transmission driver.

Figure 7:
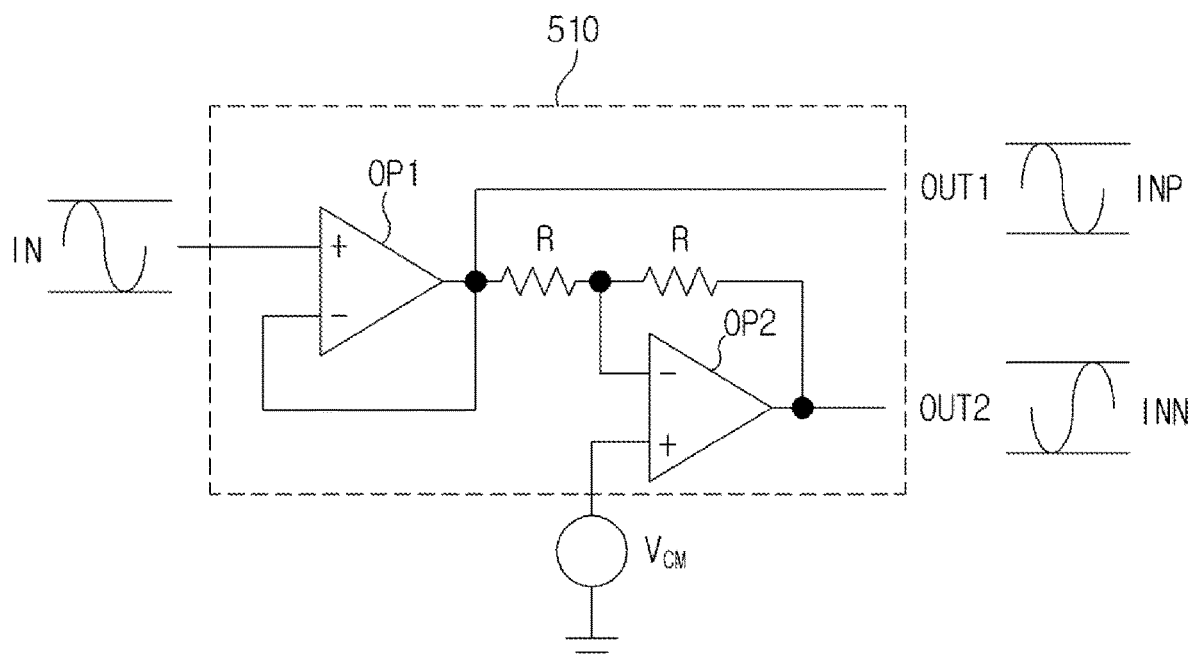
FIG. 7 is a circuit diagram of an example of a phase inverter.

FIG. 7 is a circuit diagram of an example of the phase inverter.

In FIG. 7, the phase inverter 510 according to the embodiment may be composed of a single-ended differential transformer including two OP amps.

A first OP amp OP1 functions as a buffer and buffers the input signal IN and outputs the first input signal INP.

As shown in FIG. 7, a second OP amp OP2 has a gain of 1 by using two resistors R having the same resistance value and is composed of an inverting amplifier which inverts a phase. The second OP amp OP2 may invert the phase of the first input signal INP and output the second input signal INN. Specifically, one resistor may be connected between the output terminal of the first OP amp OP1 and an inverting input terminal of the second OP amp OP2, the other resistor may be connected between the inverting input terminal of the second OP amp OP2 and an output terminal of the second OP amp OP2. Also, a voltage source $W_{CM}$ is connected to a non-inverting terminal of the second OP amp OP2, so that a feedback circuit can be configured.

Figure 8:
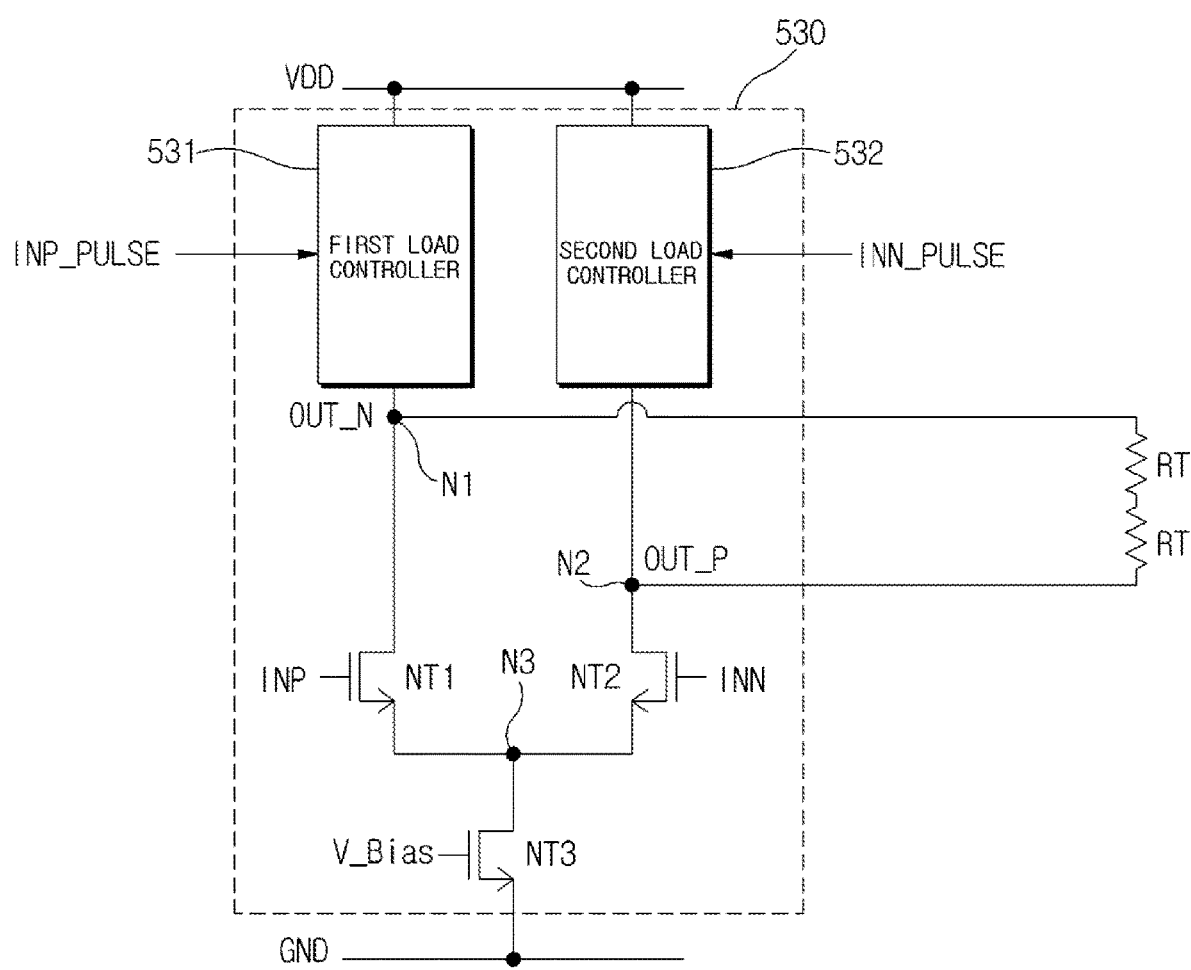
FIGS. 8 and 9 are circuit diagrams of examples of the CML driver.
Figure 9:
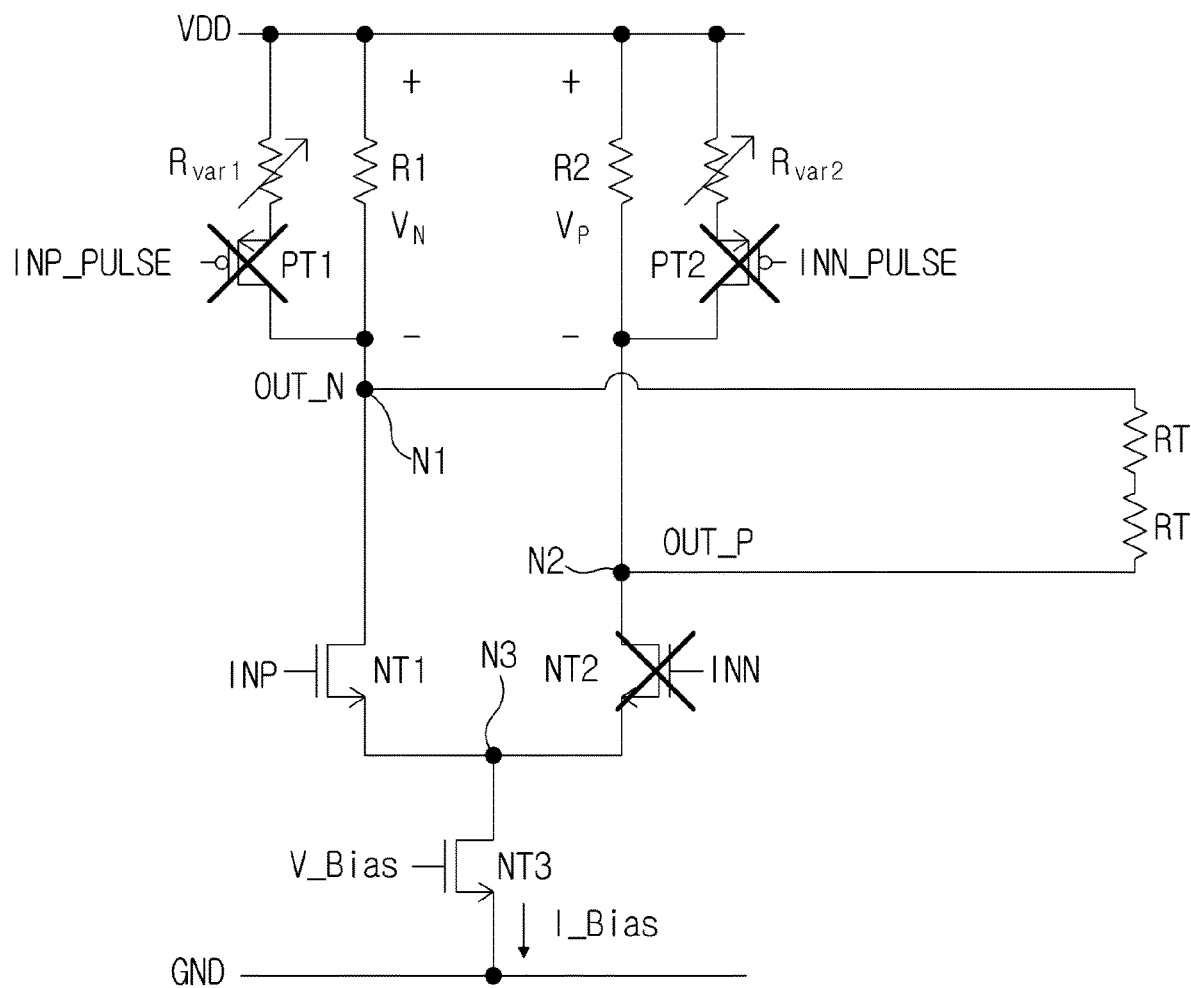

FIGS. 8 and 9 are circuit diagrams of examples of the CML driver.

In FIGS. 8 and 9, the CML driver 530 compares the first input signal INP with the second input signal INN and outputs a signal in accordance with the amplification gain adjusted by the first load resistance value and the second load resistance value. The first input signal INP and the second input signal INN are differential signals having a reverse phase.

The CML driver 530 output the first output signal OUT_N through the first output node N1, and outputs the second output signal OUT_P through the second output node N2. The first output signal OUT_N which is output through the first output node N1 and the second output signal OUT_P which is output through the second output node N2 are transmitted as a differential input signal to the load unit connected to the transmission driver.

The CML driver 530 is activated while a bias current flows by the operation of a third NMOS transistor NT3 in response to a bias control signal V_Bias. A first NMOS transistor NT1 and a second NMOS transistor NT2 compare the potential level difference between the first input signal INP and the second input signal INN in accordance with load resistance values of a first and second load controllers 531 and 532 and amplify, and then generate the first output signal OUT_N and the second output signal OUT_P. Here, the amplification gain of the CML driver 530 is adjusted according to the change of the load resistance values of the first and second load controllers 531 and 532. Therefore, the pre-emphasis equalization operation is performed in the first output signal OUT_N and the second output signal OUT_P.

The first load controllers 531 may be connected between the first output node N1 and a power supply voltage VDD and may control the first load resistance value by receiving the first pulse signal INP-PULSE.

The second load controller 532 may be connected between the second output node N2 and the power supply voltage VDD and may control the second load resistance value by receiving the second pulse signal INN-PULSE.

In FIG. 9, the first load controllers 531 may be composed of a first resistor R1, a first variable resistor Rvar1, and a first PMOS transistor PT1. One end of the first resistor R1 is connected to the power supply voltage VDD, and the other end is connected to the first output node N1. One end of the first variable resistor Rvar1 is connected to the power supply voltage VDD, and the other end is connected to the source of the first PMOS transistor PT1. The gate of the first PMOS transistor PT1 is connected to the first pulse signal INP-PULSE, the source is connected to the first variable resistor Rvar1, and the drain is connected to the first output node N1.

The second load controllers 532 may be composed of a second resistor R2, a second variable resistor Rvar2, and a second PMOS transistor PT2. One end of the second resistor R2 is connected to the power supply voltage VDD, and the other end is connected to the second output node N2. One end of the second variable resistor Rvar2 is connected to the power supply voltage VDD, and the other end is connected to the source of the second PMOS transistor PT2. The gate of the second PMOS transistor PT2 is connected to the second pulse signal INN-PULSE, the source is connected to the second variable resistor Rvar2, and the drain is connected to the second output node N2.

FIG. 9 shows the operation state of the CML driver in a section indicated by "c" of FIG. 6. Describing with reference to FIG. 9 the section indicated by "c" of FIG. 6, the first input signal INP has a high level, and the second input signal INN has a low level. Also, both the first pulse signal INP-PULSE and the second pulse signal INN-PULSE have a high level.

In the section indicated by "c", the first PMOS transistor PT1 performs a turn-off operation in accordance with the high level of the first pulse signal INP_PULSE. The first NMOS transistor NT1 performs a turn-on operation in accordance with the high level of the first input signal INP. The second PMOS transistor PT2 performs a turn-off operation in accordance with the high level of the second pulse signal INN_PULSE. The second NMOS transistor NT2 performs a turn-off operation in accordance with the low level of the second input signal INN.

The first output signal OUT_N and the second output signal OUT_P in the section indicated by "c" by the above-operations are calculated by the following equations 1 to 3. The symbol "||" in Equations 1 to 12 means a parallel connection between resistors.

Figure 10:
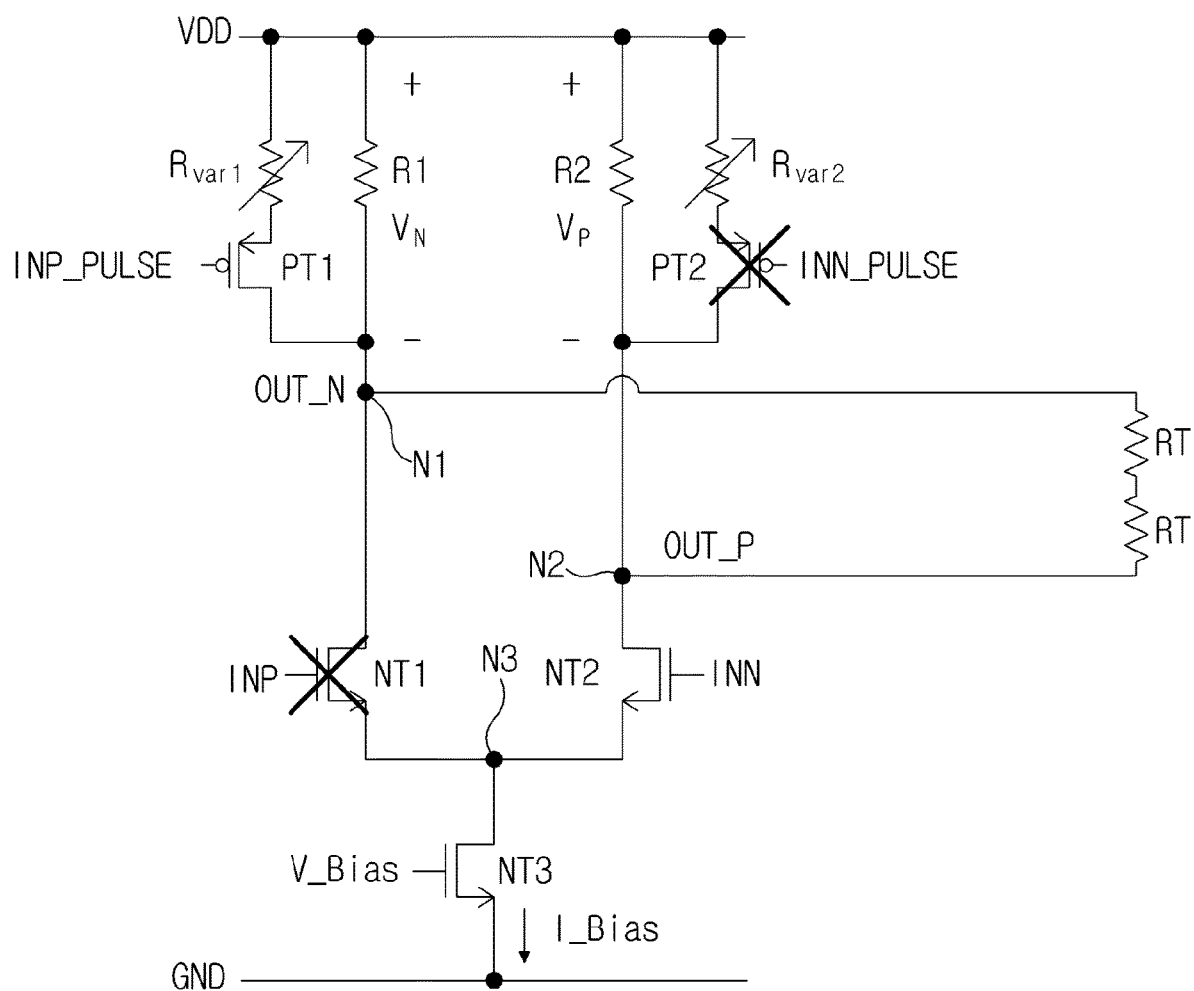
FIGS. 10 A and 10 B are circuit diagrams describing examples of the operation of the CML driver.
Figure 10:
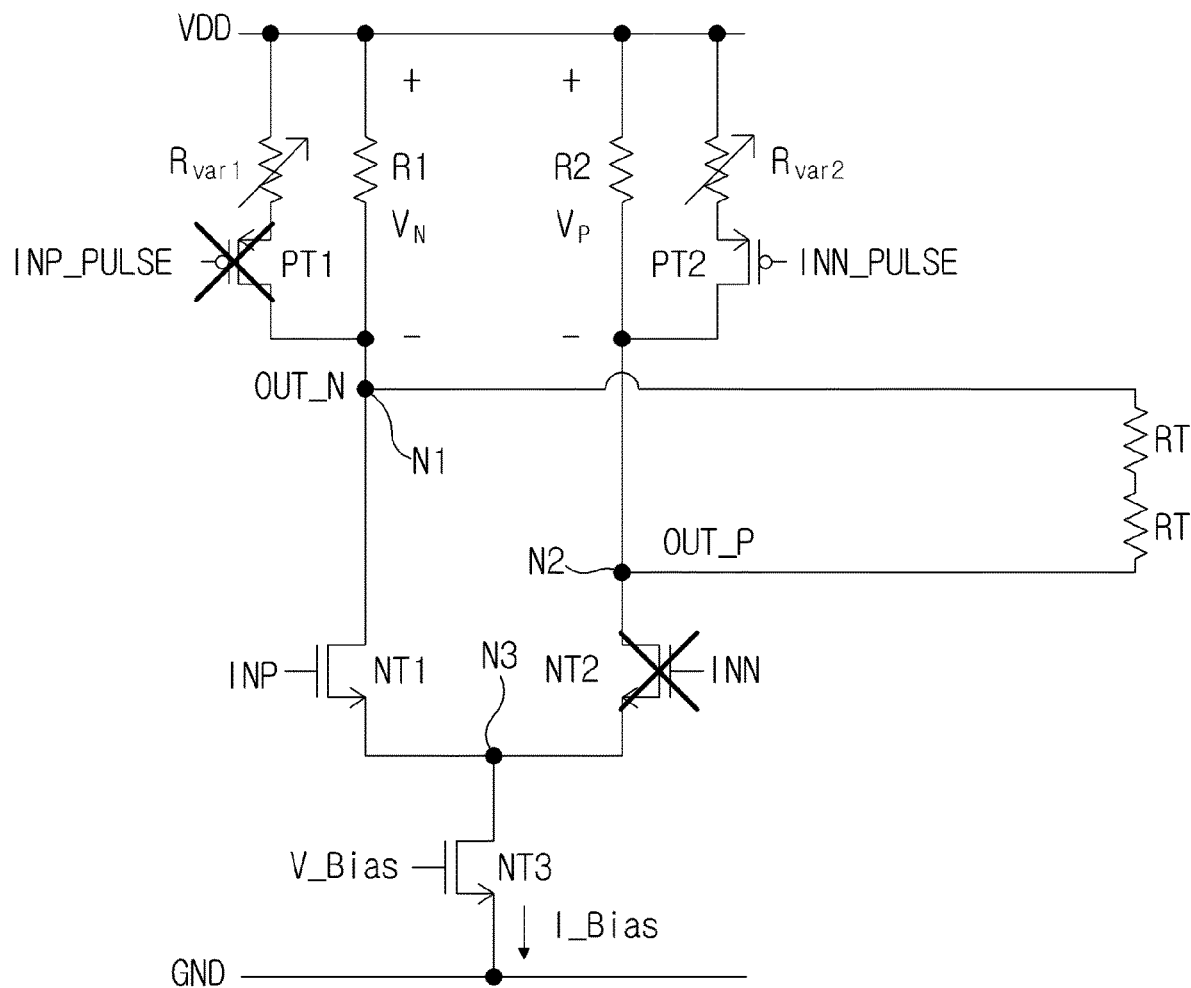

In FIGS. 9 to 10, the first resistor R1, the second resistor R2, the first variable resistor Rvar1, the second variable resistor Rvar2, a third resistor RT may be 50Ω each, and I_Bias may be 8 mA. However, each numerical value is not limited thereto.

Also, the equations OUT_N=VDD−VN and OUT_P=VDD−VP are satisfied in FIGS. 9 to 10.

In the present specification, the termination resistor may include the first resistor R1, the second resistor R2, the third resistor RT, the first variable resistor Rvar1, and the second variable resistor Rvar2 which are connected directly/indirectly to the power supply voltage VDD.

$$V_N = \frac{\text{I\_Bias} * R1 * (R2 + 2*RT)}{(R1 + R2 + 2*RT)} = \quad \text{Equation 1}$$

$$\frac{8\text{mA}*50\Omega*(50\Omega + 2*50\Omega)}{(50\Omega + 50\Omega + 2*50\Omega)} = 300\text{mV}:$$

$$V_P = \frac{V_N * R2}{(R2 + 2*RT)} = \frac{300\text{mV}*50\Omega}{(50\Omega + 2*50\Omega)} = 100\text{mV}: \quad \text{Equation 2}$$

$$V\_\text{Diff} = |\text{OUT\_N} - \text{OUT\_P}| = 200\text{mV}: \quad \text{Equation 3}$$

FIG. 10 A shows the operation state of the CML driver in the section indicated by "a" of the first pulse signal INP_PULSE in FIG. 6.

The operation of the CML driver in the section indicated by "a" will be described with reference to FIGS. 6 and 10 A. The first pulse signal INP_PULSE has a low level in synchronization with the falling edge time point of the first input signal INP. Meanwhile, the second input signal INN and the second pulse signal INN_PULSE have a high level.

In the section indicated by "a", the first PMOS transistor PT1 performs a turn-on operation in accordance with the low level of the first pulse signal INP_PULSE. The first NMOS transistor NT1 performs a turn-off operation in accordance with the low level of the first input signal INP. The second PMOS transistor PT2 performs a turn-off operation in accordance with the high level of the second pulse signal INN_PULSE. The second NMOS transistor NT2 performs a turn-on operation in accordance with the high level of the second input signal INN.

The first output signal OUT_N and the second output signal OUT_P in the section indicated by "a" by the above-operations are calculated by the following equations 4 to 6.

$$V_P = \frac{\text{I\_Bias} * R2 * ((R1 \| R_{var1}) + 2*RT)}{((R1 \| R_{var1}) + R2 + 2*RT)} = \quad \text{Equation 4}$$

$$\frac{8\text{mA}*50\Omega*((50\Omega \| 50\Omega) + 2*50\Omega)}{((50\Omega \| 50\Omega) + 50\Omega + 2*50\Omega)} = 285.7\text{mV}:$$

$$V_N = \frac{V_P * (R1 \| R_{var1})}{((R1 \| R_{var1}) + 2*RT)} = \quad \text{Equation 5}$$

$$\frac{285.7\text{mV}*(50\Omega \| 50\Omega)}{((50\Omega \| 50\Omega) + 2*50\Omega)} = 57.1\text{mV}:$$

$$V\_\text{Diff} = |\text{OUT\_N} - \text{OUT\_P}| = 228.6\text{mV}: \quad \text{Equation 6}$$

FIG. 10 B shows the operation state of the CML driver in the section indicated by "b" of the second pulse signal INN-PULSE in FIG. 6.

The operation of the CML driver in the section indicated by "b" will be described with reference to FIGS. 6 and 10 B. The second pulse signal INN-PULSE has a low level in synchronization with the falling edge time point of the second input signal INN. Meanwhile, the first input signal INP and the first pulse signal INP-PULSE have a high level.

In the section indicated by "b", the first PMOS transistor PT1 performs a turn-off operation in accordance with the high level of the first pulse signal INP_PULSE. The first NMOS transistor NT1 performs a turn-on operation in accordance with the high level of the first input signal INP. The second PMOS transistor PT2 performs a turn-on operation in accordance with the low level of the second pulse signal INN_PULSE. The second NMOS transistor NT2 performs a turn-off operation in accordance with the low level of the second input signal INN.

The first output signal OUT_N and the second output signal OUT_P in the section indicated by "b" by the above-operations are calculated by the following equations 7 to 9.

$$V_N = \frac{\text{I\_Bias} * R1 * ((R2 \| R_{var2}) + 2*RT)}{((R2 \| R_{var2}) + R1 + 2*RT)} = \quad \text{Equation 7}$$

$$\frac{8\text{mA}*50\Omega*((50\Omega \| 50\Omega) + 2*50\Omega)}{((50\Omega \| 50\Omega) + 50\Omega + 2*50\Omega)} = 285.7\text{mV}:$$

$$V_P = \frac{V_N * (R2 \| R_{var2})}{((R2 \| R_{var2}) + 2*RT)} = \quad \text{Equation 8}$$

$$\frac{285.7\text{mV}*(50\Omega \| 50\Omega)}{((50\Omega \| 50\Omega) + 2*50\Omega)} = 57.1\text{mV}:$$

$$V\_\text{Diff} = |\text{OUT\_N} - \text{OUT\_P}| = 228.6\text{mV}: \quad \text{Equation 9}$$

According to the embodiment of the present disclosure, the pre-emphasis ratio of the first output signal OUT_N and the second output signal OUT_P output from the CML driver 530, that is, the pre-emphasis ratio of the differential input signal input to the load unit, may be controlled by changing the resistance values of the first and second variable resistors Rvar1 and Rvar2.

The pre-emphasis ratio will be, as shown in the following equations 10 to 12, described with reference to FIGS. 6 and 10 B by changing the second variable resistor Rvar2 into 20Ω. According to the embodiment of the present disclosure, when the resistance value of the second variable resistor Rvar2 is changed, V_Diff can be increased, and the efficiency of pre-emphasis technique can be improved.

$$V_N = \frac{I\_Bias * R1 * ((R2 \| R_{var2}) + 2 * RT)}{((R2 \| R_{var2}) + R1 + 2 * RT)} = \quad \text{Equation 10}$$

$$\frac{8mA * 50\Omega * ((50\Omega \| 20\Omega) + 2 * 50\Omega)}{((50\Omega \| 20\Omega) + 50\Omega + 2 * 50\Omega)} = 278.3mV:$$

$$V_P = \frac{V_N * (R2 \| R_{var2})}{((R2 \| R_{var2}) + 2 * RT)} = \quad \text{Equation 11}$$

$$\frac{285.7mV * (50\Omega \| 20\Omega)}{((50\Omega \| 20\Omega) + 2 * 50\Omega)} = 34.8mV:$$

$$V\_Diff = |OUT\_N - OUT\_P| = 243.5mV: \quad \text{Equation 12}$$

In FIGS. 6 to 10, V_Diff represents a difference between differential input signals input to the load unit. As V_Diff becomes larger, the signal can be equalized even though the amplitude is attenuated in a high frequency range.

According to the embodiment of the present disclosure, when the first pulse signal INP_PULSE and the second pulse signal INN_PULSE have a low level (sections indicated by "a" and "b") in synchronization with the falling edge time points of the first input signal INP and the second input signal INN, the CML driver of the present disclosure is able to implement the pre-emphasis function according to the termination resistors connected to the power supply voltage. Also, the pre-emphasis ratio may be controlled by changing the resistance values of the first variable resistor Rvar1 and the second variable resistor Rvar2. Accordingly, the CML driver of the present disclosure is able to equalize the lost signal in a high frequency range by increasing V_Diff through the control of the termination resistor.

As described above, the driver according to the embodiment of the present disclosure generates a pulse signal synchronized at the falling edge time point of the input signal, and controls the termination resistor on the basis of the generated pulse signal, so that the pre-emphasis function can be implemented without the increase of the current consumption even though the input signal has a data repeatability. Also, the pre-emphasis ratio can be controlled by controlling the variable resistor included in the termination resistor.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A transmission driver, comprising:
    a current mode logic driver configured to output a pre-emphasis signal to which pre-emphasis technique has been applied by changing a first load resistance value and a second load resistance value based on a first pulse signal and a second pulse signal, respectively; and
    a phase inverter configured to receive an input signal and output a first input signal and a second input signal generated by inverting a phase of the first input signal to the current mode logic driver,
    wherein a falling edge of the first pulse signal is synchronized with a falling edge of the first input signal, and a falling edge of the second pulse signal is synchronized with a falling edge of the second input signal, and
    wherein the current mode logic driver comprises:
    a first NMOS transistor configured to receive the first input signal at a gate terminal, and connected between a first output node and a common node;
    a second NMOS transistor configured to receive the second input signal at a gate terminal, and connected between a second output node and the common node; and
    a third NMOS transistor connected in series with the first and second NMOS transistors.

2. The transmission driver of claim 1, wherein the phase inverter comprises:
    a first OP amp configured to generate the first input signal by buffering the input signal; and
    an inverting amplifier, comprising two resistors and a second OP amp, configured to generate the second input signal by inverting the phase of the first input signal.

3. The transmission driver of claim 1, wherein the third NMOS transistor is turned on according to a bias control signal to flow a bias current activating the current mode logic driver.

4. The transmission driver of claim 3, wherein the current mode logic driver comprises:
    a first load controller, connected between the first output node and a power supply voltage, controlling the first load resistance value by receiving the first pulse signal; and
    a second load controller, connected between the second output node and the power supply voltage, controlling the second load resistance value by receiving the second pulse signal.

5. The transmission driver of claim 4, wherein the first load controller comprises:
    a first resistor having an end connected to the power supply voltage and another end connected to the first output node;
    a first variable resistor having an end connected to the power supply voltage; and
    a first PMOS transistor connecting the first pulse signal to the gate terminal, a source terminal to another end of the first variable resistor, and a drain terminal to the first output node.

6. The transmission driver of claim 5, wherein the second load controller comprises:
    a second resistor having an end connected to the power supply voltage and another end connected to the second output node;
    a second variable resistor having an end connected to the power supply voltage; and
    a second PMOS transistor connecting the second pulse signal to the gate terminal, the source terminal to another end of the second variable resistor, and the drain terminal to the second output node.

7. The transmission driver of claim 6, wherein the current mode logic driver further comprises third resistors connected between the first output node and the second output node.

8. The transmission driver of claim 7, wherein the first pulse signal generated in synchronization with the falling edge time point of the first input signal has a low level first section, and wherein the second pulse signal generated in synchronization with the falling edge time point of the second input signal has a low level second section.

9. The transmission driver of claim 8, wherein, in the first section, the first NMOS transistor and the second PMOS transistor are turned off in the first section, and the second NMOS transistor and the first PMOS transistor are turned on.

10. The transmission driver of claim 9, wherein, in the second section, the first NMOS transistor and the second PMOS transistor are turned on, and the second NMOS transistor and the first PMOS transistor are turned off.

11. The transmission driver of claim 10, wherein, in the first and second sections, the pre-emphasis signal is output by controlling the first and second load resistance values of the current mode logic driver.

12. A transmission driver, comprising:
a current mode logic driver, comprising:
a first load controller, controlled by a first pulse signal, and connected to a power supply voltage;
a second load controller, controlled by a second pulse signal, and connected to the power supply voltage; and
a phase inverter configured to receive an input signal and output a first input signal and a second input signal generated by inverting a phase of the first input signal to the current mode logic driver,
wherein a falling edge of the first pulse signal is synchronized with a falling edge of the first input signal, and a falling edge of the second pulse signal is synchronized with a falling edge of the second input signal, and
wherein the current mode logic driver comprises:
a first NMOS transistor configured to receive the first input signal at a gate terminal, and connected between a first output node and a common node;
a second NMOS transistor configured to receive the second input signal at a gate terminal, and connected between a second output node and the common node; and
a third NMOS transistor connected in series with the first and second NMOS transistors.

13. The transmission driver of claim 12, wherein the first NMOS transistor is connected in series with the first load controller, the second NMOS transistor is connected in series with the second load controller, and the third NMOS transistor is connected in series with the first and second NMOS transistors.

14. The transmission driver of claim 12, wherein the current mode logic driver is configured to output a pre-emphasis signal to which pre-emphasis technique has been applied by changing a first load resistance value and a second load resistance value based on the first pulse signal and the second pulse signal, respectively.

15. The transmission driver of claim 12, wherein the phase inverter comprises:
a first OP amp configured to generate the first input signal by buffering the input signal; and
an inverting amplifier, comprising two resistors and a second OP amp, configured to generate the second input signal by inverting the phase of the first input signal.

16. The transmission driver of claim 12, wherein the first input signal and the second input signal have different levels.

17. The transmission driver of claim 12, wherein the third NMOS transistor is turned on according to a bias control signal to flow a bias current.

18. The transmission driver of claim 12, wherein the first load controller comprises:
a first resistor having an end connected to the power supply voltage and another end connected to a first output node;
a first variable resistor having an end connected to the power supply voltage; and
a first PMOS transistor connecting the first pulse signal to a gate terminal, a source terminal to another end of the first variable resistor, and a drain terminal to the first output node.

19. The transmission driver of claim 18, wherein the second load controller comprises:
a second resistor having an end connected to the power supply voltage and another end connected to a second output node;
a second variable resistor having an end connected to the power supply voltage; and
a second PMOS transistor connecting the second pulse signal to the gate terminal, the source terminal to another end of the second variable resistor, and the drain terminal to the second output node.

* * * * *